United States Patent
Wijaranakula et al.

[11] Patent Number: 5,827,367
[45] Date of Patent: Oct. 27, 1998

[54] APPARATUS FOR IMPROVING MECHANICAL STRENGTH OF THE NECK SECTION OF CZOCHRALSKI SILICON CRYSTAL

[75] Inventors: Witawat Wijaranakula; Akihiko Tamura, both of Vancouver, Wash.

[73] Assignee: SEH America, Vancouver, Wash.

[21] Appl. No.: 713,607

[22] Filed: Sep. 13, 1996

[51] Int. Cl.⁶ .................................................. C30B 35/00
[52] U.S. Cl. .......................... 117/208; 117/200; 117/217; 117/222; 117/900
[58] Field of Search .................................... 117/200, 208, 117/217, 222, 900; 244/158 R

[56] References Cited

U.S. PATENT DOCUMENTS

| | | | |
|---|---|---|---|
| 4,738,832 | 4/1988 | Drechsel | 117/217 |
| 4,981,549 | 1/1991 | Yamashita et al. | 117/3 |
| 5,004,519 | 4/1991 | Hariri | 117/30 |
| 5,248,378 | 9/1993 | Oda et al. | 117/217 |
| 5,264,189 | 11/1993 | Yamashita et al. | 117/204 |
| 5,441,014 | 8/1995 | Tomioka et al. | 117/213 |
| 5,443,034 | 8/1995 | Everts | 117/208 |
| 5,476,065 | 12/1995 | Ikezawa et al. | 117/217 |
| 5,573,591 | 11/1996 | Ikezawa et al. | 117/20 |

FOREIGN PATENT DOCUMENTS

| | | |
|---|---|---|
| 02169989 | 6/1990 | European Pat. Off. . |
| 0 509 312 A1 | 3/1992 | European Pat. Off. . |
| 0 612 867 A1 | 2/1994 | European Pat. Off. . |
| 0 671 491 A1 | 2/1995 | European Pat. Off. . |
| 1 316 707 | 12/1963 | France . |
| 2 562 915 A1 | 4/1985 | France . |
| 1191 789 | 4/1965 | Germany . |
| C 30 B 15/20 | 2/1989 | Germany . |

OTHER PUBLICATIONS

Minimization of thermoelastic stresses in Czochralski grown silicon: application of the integrated system model; D.E. Bornside, T.A. Kinney and R.A. Brown; Journal of Crystal Growth 108 (1991) 779–805; Department of Chemical Engineering and Materials Processing Center, Massachusetts Institute of Technology, Aug. 23, 1990.

*Primary Examiner*—Felisa Garrett
*Attorney, Agent, or Firm*—Bell Seltzer Intellectual Property Group of Alston & Bird, LLP

[57] ABSTRACT

An apparatus and method for growing large diameter silicon crystals using the Czochralski (Cz) method, wherein the neck section of the crystal is significantly strengthened to eliminate the risk of breakage in the neck section, by providing a heat shield assembly which is located adjacent to the neck section and ascends in conjunction therewith to force the cooling gas directly onto the neck section of the silicon ingot.

45 Claims, 4 Drawing Sheets

APPARATUS FOR IMPROVING MECHANICAL STRENGTH OF THE NECK SECTION OF CZOCHRALSKI SILICON CRYSTAL

BACKGROUND OF THE INVENTION

1. Area of the Art

The invention relates generally to the field of manufacturing semiconductor single crystal, and specifically to the Czochralski (CZ) method of growing silicon single crystal of a large diameter with improved mechanical strength of the neck section of the silicon single crystal.

2. Description of the Prior Art

The Czochralski (Cz) method is well known in the prior art for growing a silicon single crystal free of dislocations. According to the Cz method, a seed crystal is lowered into contact with a silicon melt, and then pulled out of the melt at a controlled lift rate. The surface tension of the silicon at the melt interface allows molten silicon to be pulled out of the crucible, where it cools and solidifies on the seed, thus forming a single crystal.

One of the inherent deficiencies in growing a crystal by the CZ method is the generation of dislocations in the atomic lattice of the crystal caused by thermal stress. In an effort to eliminate such dislocations, the prior art technology calls for growing a first part of the crystal, known as the "neck section," to a diameter smaller than that of the seed. A typical neck section of the crystal will be reduced to approximately less than or equal to three millimeters in diameter. As the crystal neck is grown, the cross-section of the neck, and the thermal stress related thereto, are reduced, which help to eliminate dislocations in the crystal. The neck continues to be grown until the neck is visually determined to be dislocation free by the operator, upon which the cone and body of the crystal are grown. The diameters of the neck section must be small in diameter (e.g., 2 to 4 millimeters) to eliminate the dislocation generation.

Because the CZ method of growing crystals is very power intensive and very time intensive, productivity measures call for growing crystals as long as possible, being physically constrained only by the dimensions of the pulling machine and the available molten silicon. In addition, as integrated circuit technology increases, the demand for larger diameter crystals increases.

The larger diameter crystals result in increased weight of the grown crystal. This increase in weight becomes a concern, as the entire weight of the crystal must be supported by the neck section of the crystal. Of particular concern is the strength of the neck section at elevated temperatures. The high temperature of approximately $\geq 650°$ C. causes the thermal related strength properties of the silicon to be such that the neck section could stretch or break from plastic deformation, causing a total loss of the crystal being grown. Further, safety related issues arise if the crystal were to break.

One prior art attempt to address the neck section strength problem relating to the growth of large diameter crystals of 300 mm or larger was to maintain the neck section as cool as possible to improve the thermal properties of the silicon. For example, European Patent publication EP-0-671-491-A1 issued to Shin-Etsu Handotai Co. Ltd. discloses a method of increasing the strength of the neck section of the crystal by growing the neck section with lengths between 200 mm and 600 mm. It further calls for restricting the thickness variation of the neck to less than 1 mm, and the minimum diameter of the neck to be $\geq 2.5$ mm. The increased length of the neck allows the neck to get farther away from the molten silicon and the heaters, thus allowing the neck to cool down and thereby increase the strength properties of the neck. However, although effective in cooling the neck and thus providing strength and eliminating breakage of the neck section, this method causes a loss of productivity due to the need to use 200 mm to 600 mm of the pulling chamber for the neck section, which cannot then be used for ingot fabrication. Another disadvantage of this method is the difficulty in maintaining a thin neck with a restricted thickness variation for an extended length.

SUMMARY OF THE INVENTION

It is an object of the present invention to provide a CZ crystal growing furnace for solving the above-mentioned problems, particularly for keeping the neck section as cool as possible to improve the thermal strength properties of the silicon.

These and other objects and advantages are achieved by a CZ crystal growing furnace comprising a heat shield assembly that can be lowered to the interface of the seed and neck, and that can then be raised at a controlled speed to exactly match the extrusion of the neck from the molten silicon. The heat shield assembly comprises an outer shield with or without an inner shield. If both shields are used, the outer shield uses a plurality of ribs to support the inner shield and allows a space between said outer shield and said inner shield for argon gas to flow therebetween providing maximum cooling. Argon gas flows from the top of the pulling chamber down over the neck section of the crystal, passing between the inner shield and neck section, as well as between the outer and inner shields. The heat shield assembly protects the neck from radiative heat transfer, which occurs when the neck section of the crystal is subject to the molten silicon environment of the growing furnace.

The present invention has numerous advantages. Its heat shield design is specific to cooling the neck section of the silicon ingot. The heat shield assembly ascends exactly with the ingot as it ascends from the melt. It is effective in lowering the temperature of the neck section and thus enables the formation of a neck section having higher mechanical strength, thereby eliminating or minimizing the breakage problem with respect to the neck section. By utilizing the present invention, the crystals can be grown with a shorter neck, thereby increasing production yield. Therefore, the subject invention eliminates the problems associated with the prior methods, e.g., loss of productivity, and difficulties in maintaining a thin neck section with a restricted thickness variation for an extended length.

Further benefits and advantages of the invention will become apparent from a consideration of the following detailed description given with reference to the accompanying drawings, which specify and show preferred embodiments of the invention.

DESCRIPTION OF THE FIGURES

The objects and advantages of the present invention will become more readily apparent to those ordinarily skilled in the art through reviewing the following detailed description and accompanying drawings. These drawings depict only a typical embodiment of the invention and do not therefore limit its scope. They serve to add specificity and detail, in which.

DETAILED DESCRIPTION OF THE INVENTION

The present invention is directed to an apparatus and method for improving mechanical strength of the neck section of Czochralski (Cz) silicon crystal. The present invention provide a CZ crystal growing furnace which comprises a radiative heat shield that can be lowered to the interface of the seed and neck for keeping the neck cool, thereby improving the mechanical strength of the Cz silicon crystal.

Figure 1:
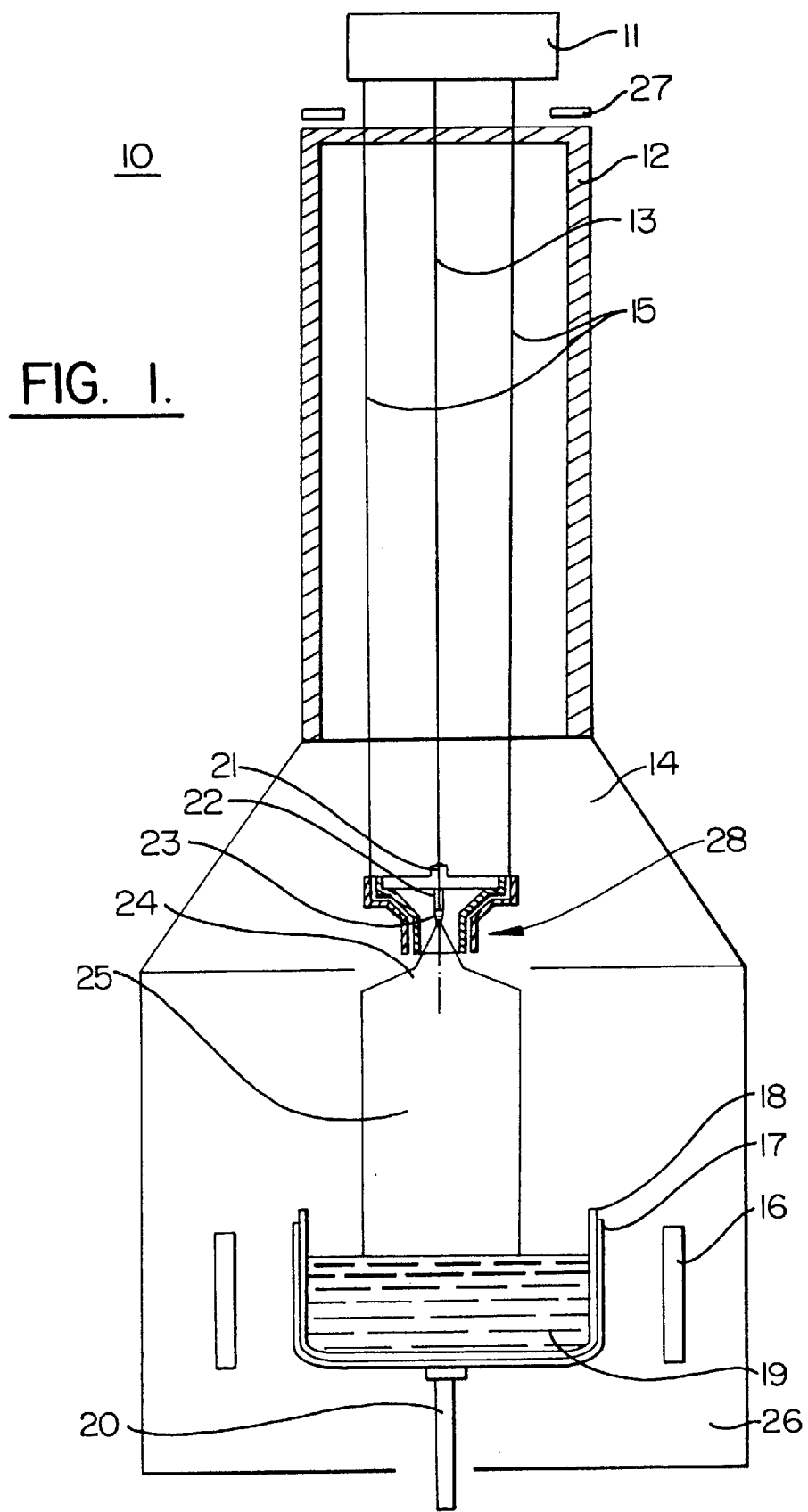
FIG. 1 is a cross-sectional diagram view of a CZ crystal growing furnace having a heat shield assembly of the present invention.

Referring to the drawings more particularly by reference numbers, FIG. 1 shows a Czochralski (Cz) crystal growing furnace 10 with a heat shield assembly 28 of the present invention. Furnace 10 includes a crucible 18 adapted to hold molten semiconductor material 19 such as but not limited to molten silicon or gallium arsenide etc. It is preferred that crucible 18 is constructed of quartz, with an inner layer of fused silica.

Crucible 18 is filled with pieces of raw silicon, and heated to molten silicon 19 by a heater 16 located adjacent to crucible 18. Crucible 18 is typically housed in a susceptor 17 which is coupled by a shaft 20 to a motor (not shown) that rotates the silicon to provide a more uniform temperature distribution throughout the molten silicon.

Crucible 18 is encapsulated by a furnace tank 26, a furnace cover 14, and a pull chamber 12. Pull chamber 12 contains a door (not shown) that allows a formed crystal ingot to be removed from the furnace.

Extending through pull chamber 12 is a seed chuck assembly 21 holding a seed 22. Seed chuck assembly 21 is suspended from a cable 13, which in turn is connected to a pulley assembly 11 which can move seed chuck assembly 21 relative to crucible 18. While growing a silicon single crystal, seed 22 is lowered into contact with silicon melt 19, and then is pulled out of melt 19 at a controlled lift rate to form a single crystal.

To eliminate dislocations, the first part of the crystal, known as the neck section 23, is grown first. Neck section 23 has a diameter smaller than that of seed 22. As crystal neck 23 is grown, the cross-section of the neck and hence the thermal stress is reduced and thus helping to eliminate dislocations in the crystal. After neck 23 is grown free of dislocation, cone 24 and body 25 of the crystal are grown.

Furnace 10 also has a cooling system 27 which creates a gaseous stream in pull chamber 12. The cooling system is very well known in the industry and is described in the following references: Landbolt-Börnstein, *numerical Data and Functional Relationships in Science and Technology*, 17 (C) (1984); R. Neda, J. B. Mullin, *Crystal Growth and Characterization*, Proceedings of the ISSCG2-Springschool, Japan, (1974); W. Zwehner, D. Huber, R. G. Seidensticker, R. B. Heinmann, *Silicon Chemical Etching Crystals, Growth, Properties and Applications*, (1982). The gaseous stream cools ingot 25 and prevents contamination of the silicon. In one of the preferred embodiments of the present invention, cooling system 27 provides a stream of argon gas flow from 20 to 100 liters per minute per cooling system 27 at a pressure from 20 to 100 torr.

Heat shield assembly 28 is supported by a plurality of cables 15 which in turn are connected to a pulley assembly 11. Pulley assembly can move the heat shield assembly 28 relative to and in conjunction with the movement of the seed feeder assembly 21. In a preferred embodiment, three cables are used to connect heat shield assembly 28 to pulley assembly 11.

Figure 2:
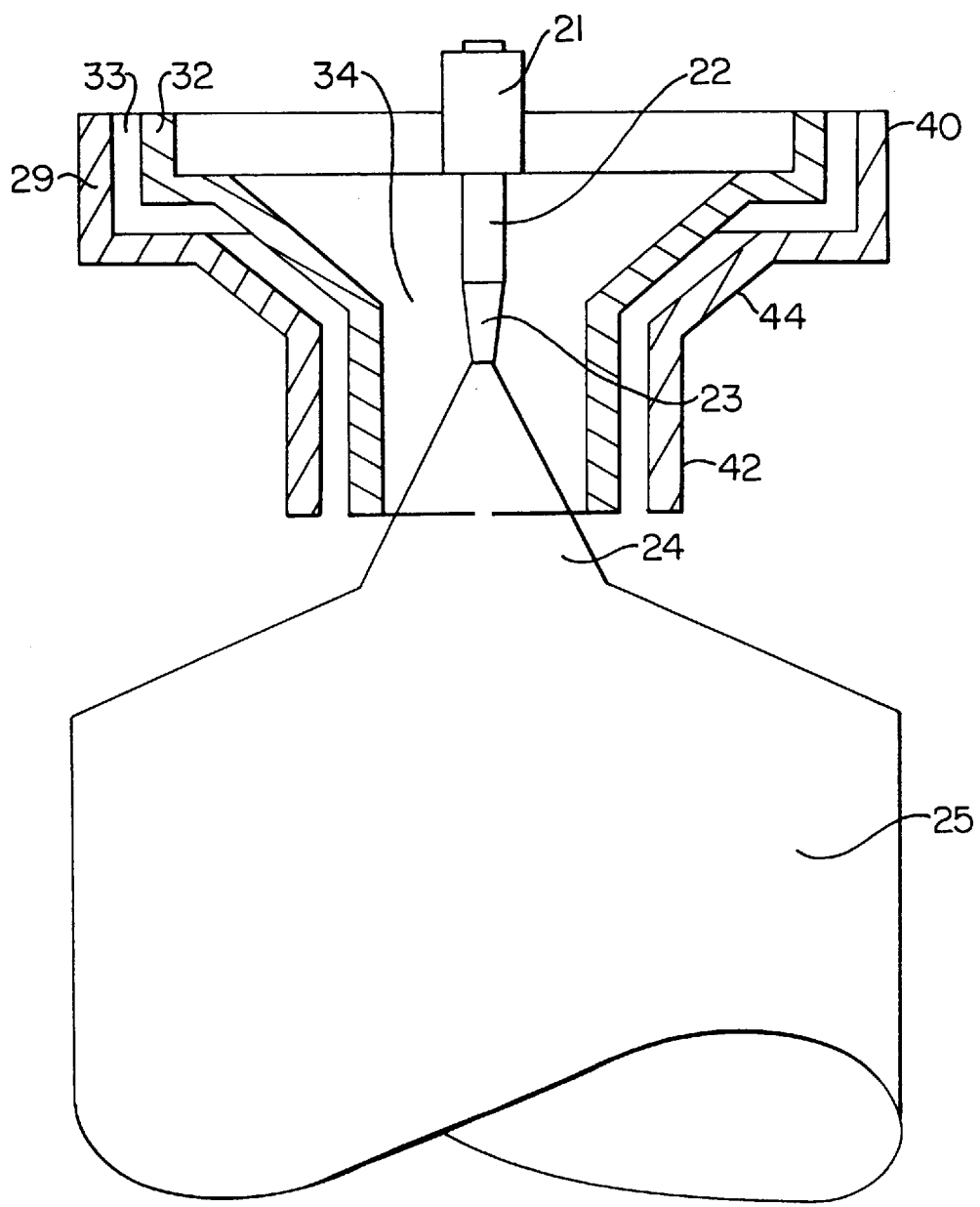
FIG. 2 is an enlarged cross-sectional diagram view showing the composite view of the heat shield assembly encompassing the seed, neck, cone, and initial desired diameter section of the crystal.

As illustrated in FIG. 2 for the preferred embodiment, heat shield assembly 28 comprises an outer heat shield 29, an inner heat shield 32, a plurality of outer gas flow chambers 33, and an inner gas flow chamber 34. In a preferred embodiment, outer heat shield 29 has a generally cylindrical shaped upper section 40 positioned adjacent to seed chuck assembly 21, a generally cylindrical shaped lower section 42 with a reduced diameter and positioned surrounding neck section 23 and part of shoulder section 24 of silicon ingot 25, and a generally truncated conical shaped middle section 44 connecting the upper and the lower sections and surrounding seed 22.

Figure 4:
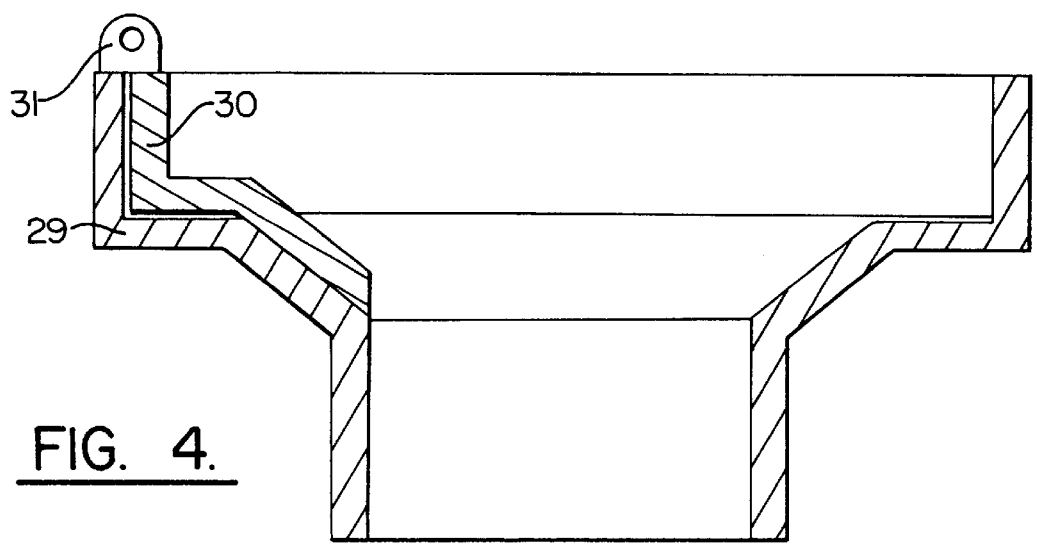
FIG. 4 is an enlarged cross-sectional diagram view of the outer section of the heat shield showing a cross section of one support rib.
Figure 3:
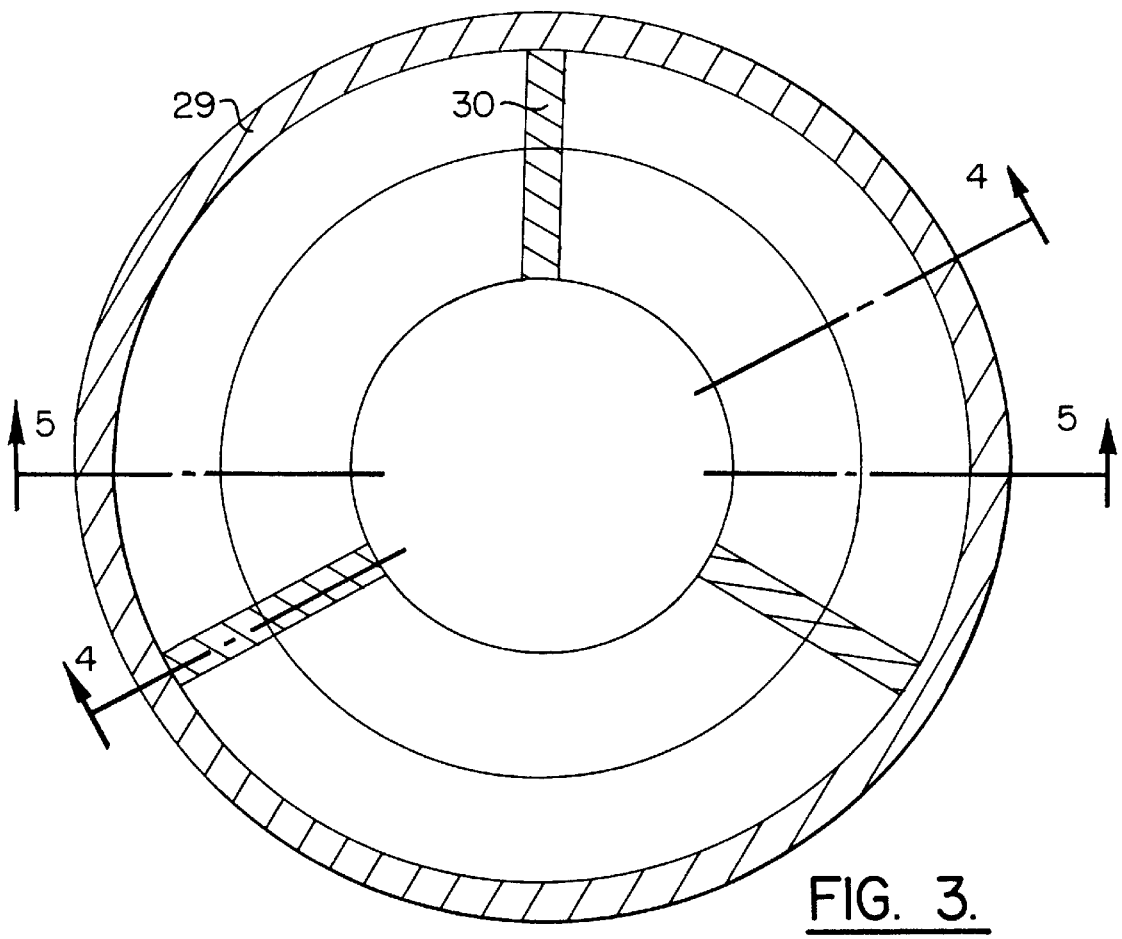
FIG. 3 is an enlarged top diagram view of the outer section of the heat shield showing a plurality of support ribs.

FIG. 3 and FIG. 4 illustrate the outer heat shield 29 from a top view and cross sectional view respectively. It is preferred that the outer heat shield 29 have a plurality of support ribs 30 which hold the inner heat shield 32. The spacing between the support ribs 30 provides a plurality of outer gas flow chambers 33.

In an alternative embodiment, heat shield assembly may only contain the outer heat shield 29 forming a gas flow chamber for passage of the cooling gas.

The heat shield assembly 28 is preferably constructed of graphite, with a coating of silicon nitride, silicon carbide, molybdenum, or the like. Alternatively, it is preferably constructed of graphite fiber.

The heat shield assembly 28 also contains a heat shield lifting support for connecting cable 15 to outer heat shield 29. In a preferred embodiment as shown in FIG. 4, at the intersection of the outer heat shield 29 and the support ribs 30 lies a heat shield lifting support 31. Alternatively, the heat shield lifting support 31 may be located anywhere on the surface of the outer heat shield. Preferably, heat shield lifting support 31 may be a protrusion extending from outer heat shield 29 and defining a hole for holding cable 15.

Figure 5:
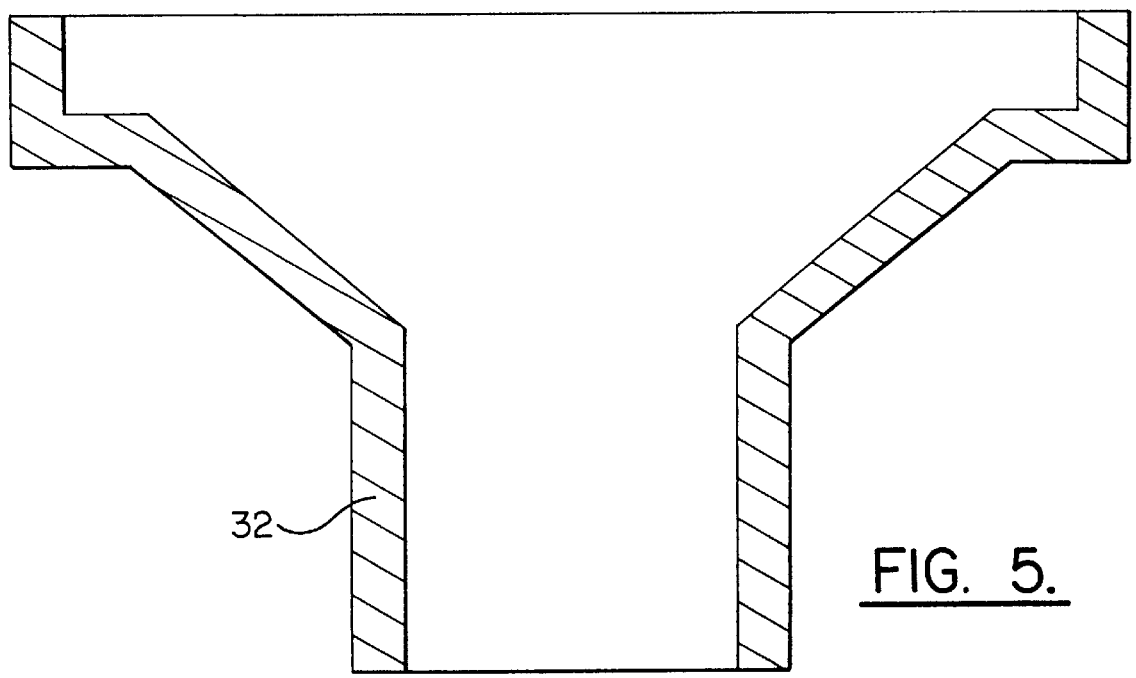
FIG. 5 is an enlarged cross-sectional diagram view of the inner section of the heat shield.

FIG. 5 illustrates the cross sectional area of the inner heat shield 32. It has a similar configuration but a small overall dimension as that of the outer shield, such that when it is supported by the ribs 30 within the outer shield, a space is maintained therebetween for the passage of the cooling gas. Inner heat shield 32 also forms an inner gas flow chamber 34 for passage of the cooling gas.

The present invention provides a method for improving the mechanical strength of a neck section of a large diameter silicon crystal ingot produced by utilizing a Czochralski (Cz) crystal growing furnace. According to the method of the present invention, the neck section of the crystal ingot is shielded by a heat shield assembly from radiative heat transferred within the furnace. The heat shield assembly also provides a gas flow chamber for regulating the cooling gas flow through the neck section to keep the neck section as cool as possible. The heat shield assembly is suspended and moved relative to and in conjunction with the movement of the seed chuck assembly, such that the heat shield assembly can be lowered to the interface of said seed and said neck section of said crystal ingot, and then be raised at a controlled speed to exactly match the extrusion of said neck section from said molten silicon. Because the heat shield assembly matches the extrusion of the neck section, the cooling gas is directed to the neck section by the gas flow chamber to cool the neck section.

A system in accordance with the present invention may be embodied in other specific forms without departing from its essential characteristics. The described embodiment is to be considered in all respects only as illustrative and not as restrictive. The scope of the invention is, therefore, indicated by the appended claims rather than by the foregoing description.

What is claimed is:

1. A heat shield assembly used in conjunction with a Czochralski (Cz) crystal growing furnace which utilizes a seed chuck assembly for holding a seed to grow a crystal ingot from molten semiconductor material and has a cooling system for providing a cooling gas for cooling said ingot, the heat shield assembly comprising a heat shield for protecting a neck section of said crystal ingot from radiative heat transferred within said furnace, and forming a gas flow chamber which regulate said cooling gas to flow over the neck section of said crystal ingot to provide cooling to said neck section, thereby increasing the mechanical strength thereof.

2. The device as defined in claim 1, wherein said heat shield has a generally cylindrical shaped upper section positioned adjacent to said seed assembly, a generally cylindrical shaped lower section with a reduced diameter and positioned surrounding the neck section of said silicon ingot, and a generally truncated conical shaped middle section connecting the upper and the lower sections and surrounding said seed.

3. The device as defined in claim 1, wherein said heat shield assembly also includes another heat shield for forming an inner gas chamber for passage of said cooling air to provide further protection of said neck section from radiative heat transfer, said another heat shield having a configuration substantially corresponding to that of said heat shield, said another heat shield being located at least in part within said heat shield, said heat shields defining between them a space for passage of said cooling air therethrough.

4. The device as defined in claim 3, wherein said heat shield assembly further comprises a plurality of supporting ribs located between and interconnecting said another and said heat shields, dividing said space therebetween into a plurality of gas flow chambers for cooling of said neck section of said crystal ingot.

5. The device as defined in claim 1, wherein said heat shield assembly further comprises means for suspending and moving said heat shield assembly relative to and in conjunction with the movement of said seed assembly, such that said heat shield assembly can be lowered to the interface of said seed and said neck section of said crystal ingot, and then be raised at a controlled speed to match the extrusion of said neck section from said molten silicon.

6. The device as defined in claim 5, wherein said heat shield assembly further comprises a heat shield lifting support attached to said heat shield for connecting the said heat shield to said moving means.

7. The device as defined in claim 1, wherein said heat shield is constructed of graphite.

8. The device as defined in claim 7, wherein said heat shield has a coating of silicon nitride.

9. The device as defined in claim 7, wherein said heat shield has a coating of silicon carbide.

10. The device as defined in claim 7, wherein said heat shield has a coating of molybdenum.

11. The device as defined in claim 1, wherein said heat shield is constructed of graphite fiber.

12. The device as defined in claim 1, wherein said semiconductor material is silicon.

13. A heat shield assembly used in conjunction with a Czochralski (Cz) crystal growing furnace which utilizes a seed chuck assembly for holding a seed for growing a crystal ingot from molten semiconductor material and has a cooling system for generating a cooling gas for cooling said ingot, the heat shield assembly comprising:

a. an outer heat shield for protecting a neck section of said crystal ingot from radiative heat transfer within said furnace, and forming a gas flow chamber which regulate said cooling gas to flow over the neck section of said crystal ingot; and b. means for suspending and moving said heat shield assembly relative to and in conjunction with the movement of said seed chuck assembly, such that said heat shield assembly can be lowered to the interface of said seed and said neck section of said crystal ingot, and then be raised at a controlled speed to exactly match the extrusion of said neck section from said molten silicon;

c. whereby said heat shield assembly protects said neck section of said crystal ingot from radiative heat transfer, and regulates said cooling gas to provide direct cooling to said neck section, thereby increase the mechanical strength thereof.

14. The device as defined in claim 13, wherein said outer heat shield has a generally cylindrical shaped upper section positioned adjacent to said seed chuck assembly, a generally cylindrical shaped lower section with a reduced diameter and positioned surrounding the neck section of said silicon ingot, and a generally truncated conical shaped middle section connecting the upper and the lower sections and surrounding said seed.

15. The device as defined in claim 13, wherein said heat shield assembly also comprises an inner heat shield for forming an inner gas chamber for passage of said cooling air to provide further protection of said neck section from radiative heat transfer, the inner heat shield having a configuration substantially corresponding to that of said outer heat shield, said outer heat shield having a first diameter, said inner heat shield having a second diameter, and said second diameter is smaller than said first diameter; said heat shields defining between them a space for passage of said cooling air therethrough.

16. The device as defined in claim 15, wherein said heat shield assembly further comprises a plurality of supporting ribs located between and interconnecting said inner and outer heat shields, dividing said space therebetween into a plurality of outer gas flow chambers for further cooling of said neck section of said crystal ingot.

17. The device as defined in claim 13, wherein said heat shield assembly further comprises a heat shield lifting support attached to said outer heat shield for connecting the outer heat shield to said moving means.

18. The device as defined in claim 13, wherein said outer and inner heat shields are constructed of graphite.

19. The device as defined in claim 18, wherein said outer and inner heat shields have a coating of Silicon Nitride.

20. The device as defined in claim 18, wherein said outer and inner heat shields have a coating of Silicon Carbide.

21. The device as defined in claim 18, wherein said outer and inner heat shields have a coating of molybdenum.

22. The device as defined in claim 13, wherein said outer and inner heat shields are constructed of graphite fiber.

23. The device as defined in claim 13, wherein said semiconductor material is silicon.

24. A heat shield assembly used in conjunction with a Czochralski (Cz) crystal growing furnace which utilizes a seed chuck assembly for holding a seed for growing a crystal ingot from semiconductor material and has a cooling system for generating a cooling gas for cooling said ingot, the heat shield assembly comprising:
   a. an outer heat shield for protecting a neck section of said crystal ingot from radiative heat transfer within said furnace, and forming a gas flow chamber which regulate said cooling gas to flow over the neck section of said crystal ingot;
   b. an inner heat shield for forming an inner gas chamber for passage of said cooling air to provide further protection of said neck section from radiative heat transfer, the inner heat shield having a configuration substantially corresponding to that of said outer heat shield, said outer heat shield having a first diameter, said inner heat shield having a second diameter, and said second diameter is smaller than said first diameter; said heat shields defining between them a space for passage of said cooling air therethrough;
   c. a plurality of supporting ribs located between and interconnecting said inner and outer heat shields, dividing said space therebetween into a plurality of outer gas flow chambers for further cooling of said neck section of said crystal ingot; and
   d. means for suspending and moving said heat shield assembly relative to and in conjunction with the movement of said seed chuck assembly, such that said heat shield assembly can be lowered to the interface of said seed and said neck section of said crystal ingot, and then be raised at a controlled speed to exactly match the extrusion of said neck section from said molten silicon;
   e. whereby said heat shield assembly protects said neck section of said crystal ingot from radiative heat transfer, and regulates said cooling gas to provide direct cooling to said neck section, thereby increase the mechanical strength thereof.

25. The device as defined in claim 24, wherein said outer heat shield has a generally cylindrical shaped upper section positioned adjacent to said seed chuck assembly, said generally cylindrical shaped upper section having a first diameter; a generally cylindrical shaped lower section positioned surrounding the neck section of said silicon ingot, said generally cylindrical shaped lower section having a second diameter which is smaller than the first diameter; and a generally truncated conical shaped middle section connecting the upper and the lower sections and surrounding said seed.

26. The device as defined in claim 24, wherein said heat shield assembly further comprises a heat shield lifting support connected to said outer heat shield.

27. The device as defined in claim 24, wherein said outer and inner heat shields are constructed of graphite.

28. The device as defined in claim 27, wherein said outer and inner heat shields have a coating of Silicon Nitride.

29. The device as defined in claim 27, wherein said outer and inner heat shields have a coating of Silicon Carbide.

30. The device as defined in claim 27, wherein said outer and inner heat shields have a coating of molybdenum.

31. The device as defined in claim 24, wherein said outer and inner heat shields are constructed of graphite fiber.

32. The device as defined in claim 24, wherein said semiconductor material is silicon.

33. A Czochralski (Cz) crystal growing furnace having a seed chuck assembly for holding a seed for growing a crystal ingot from semiconductor material and having a cooling system for generating a cooling gas for cooling said ingot, the Cz crystal growing furnace comprising a heat shield assembly which comprises at least one heat shield for protecting a neck section of said crystal ingot from radiative heat transferred within said furnace, and forming a gas flow chamber which regulate said cooling gas to flow over the neck section of said crystal ingot to provide direct cooling to said neck section, thereby increases the mechanical strength thereof.

34. The device as defined in claim 33, wherein said at least one heat shield has a generally cylindrical shaped upper section positioned adjacent to said seed chuck assembly, said generally cylindrical shaped upper section having a first diameter; a generally cylindrical shaped lower section positioned surrounding the neck section of said silicon ingot, said generally cylindrical shaped lower section having a second diameter which is smaller than the first diameter; and a generally truncated conical shaped middle section connecting the upper and the lower sections and surrounding said seed.

35. The device as defined in claim 33, wherein said heat shield assembly also comprises an inner heat shield for forming an inner gas chamber for passage of said cooling air to provide further protection of said neck section from radiative heat transfer, the inner heat shield having a configuration substantially corresponding to that of said outer heat shield, said outer heat shield having a first diameter, said inner heat shield having a second diameter, and said second diameter is smaller than said first diameter; said heat shields defining between them a space for passage of said cooling air therethrough.

36. The device as defined in claim 35, wherein said heat shield assembly further comprises a plurality of supporting ribs located between and interconnecting said inner and outer heat shields, dividing said space therebetween into a plurality of outer gas flow chambers for further cooling of said neck section of said crystal ingot.

37. The device as defined in claim 33, wherein said heat shield assembly further comprises means for suspending and moving said heat shield assembly relative to and in conjunction with the movement of said seed chuck assembly, such that said heat shield assembly can be lowered to the interface of said seed and said neck section of said crystal ingot, and then be raised at a controlled speed to exactly match the extrusion of said neck section from said molten silicon.

38. The device as defined in claim 37, wherein said heat shield assembly further comprises a heat shield lifting support attached to said outer heat shield for connecting the outer heat shield to said moving means.

39. The device as defined in claim 33, wherein said outer and inner heat shields are constructed of graphite.

40. The device as defined in claim 39, wherein said outer and inner heat shields have a coating of Silicon Nitride.

41. The device as defined in claim 39, wherein said outer and inner heat shields have a coating of Silicon Carbide.

42. The device as defined in claim 39, wherein said outer and inner heat shields have a coating of molybdenum.

43. The device as defined in claim 33, wherein said outer and inner heat shields are constructed of graphite fiber.

44. The device as defined in claim 33, wherein said semiconductor material is silicon.

45. A heat shield assembly used in conjunction with a Czochralski (Cz) crystal growing furnace which utilizes a seed assembly for holding a seed to grow a crystal ingot from molten silicon, the heat shield assembly comprising a heat shield for protecting a neck section of said crystal ingot from radiative heat transferred within said furnace, so as to lower the temperature of said neck section, thereby increasing the mechanical strength thereof.

* * * * *